United States Patent
Arai et al.

(10) Patent No.: US 7,727,810 B2
(45) Date of Patent: Jun. 1, 2010

(54) WAFER DIVIDING METHOD

(75) Inventors: Kazuhisa Arai, Tokyo (JP); Masatoshi Nanjo, Tokyo (JP)

(73) Assignee: Disco Corporation, Tokyo (JP)

( * ) Notice: Subject to any disclaimer, the term of this patent is extended or adjusted under 35 U.S.C. 154(b) by 330 days.

(21) Appl. No.: 11/490,243

(22) Filed: Jul. 21, 2006

(65) Prior Publication Data
US 2007/0029684 A1 Feb. 8, 2007

(30) Foreign Application Priority Data
Aug. 2, 2005 (JP) .............................. 2005-224471

(51) Int. Cl.
*H01L 21/00* (2006.01)
(52) U.S. Cl. ............... 438/113; 438/458; 257/E21.237; 257/E21.238
(58) Field of Classification Search .................. 438/33, 438/68, 113, 114, 458, 460, 110, 118; 257/E21.237, 257/E21.214, E21.238, E21.483
See application file for complete search history.

(56) References Cited

U.S. PATENT DOCUMENTS

| | | | |
|---|---|---|---|
| 5,418,190 A * | 5/1995 | Cholewa et al. | 438/33 |
| 5,904,548 A * | 5/1999 | Orcutt | 438/462 |
| 6,074,896 A * | 6/2000 | Dando | 438/114 |
| 6,297,131 B1 * | 10/2001 | Yamada et al. | 438/464 |
| 6,344,402 B1 * | 2/2002 | Sekiya | 438/460 |
| 6,593,170 B2 * | 7/2003 | Tateiwa et al. | 438/114 |
| 6,686,225 B2 * | 2/2004 | Wachtler | 438/114 |
| 6,919,262 B2 * | 7/2005 | Senoo et al. | 438/464 |
| 7,179,723 B2 * | 2/2007 | Genda et al. | 438/462 |
| 7,374,971 B2 * | 5/2008 | Yuan et al. | 438/113 |
| 2003/0121511 A1 * | 7/2003 | Hashimura et al. | 125/2 |
| 2006/0079024 A1 * | 4/2006 | Akram | 438/110 |

FOREIGN PATENT DOCUMENTS

JP 2002-299295 10/2002

* cited by examiner

*Primary Examiner*—Khiem D Nguyen
(74) *Attorney, Agent, or Firm*—Smith, Gambrell & Russell, LLP

(57) ABSTRACT

A method of dividing a wafer having a plurality of areas, which are sectioned by the streets formed on the front surface in a lattice pattern and a plurality of devices, which are formed in the sectioned areas, along streets, the method comprising a first cutting step for holding the front surface of the wafer on a chuck table of a cutting machine and forming a first groove having a depth that is about half of the thickness of the wafer, along the streets from the rear surface of the wafer; a second cutting step for holding the rear surface of the wafer on a chuck table and forming a second groove which does not reach the first groove, along the streets from the front surface of the wafer; and a dividing step for breaking an uncut portion between the first groove and the second groove by exerting external force along the streets of the wafer, on which the first grooves and the second grooves have been formed.

5 Claims, 5 Drawing Sheets

WAFER DIVIDING METHOD

FIELD OF THE INVENTION

The present invention relates to a method of dividing a wafer such as a semiconductor wafer, along predetermined streets.

DESCRIPTION OF THE PRIOR ART

In the production process of a semiconductor device, a plurality of areas are sectioned by dividing lines called "streets" arranged in a lattice pattern on the front surface of a substantially disk-like semiconductor wafer, and a device such as IC or LSI is formed in each of the sectioned areas. Individual semiconductor chips are manufactured by cutting this semiconductor wafer along the dividing lines to divide it into the areas each having a device formed thereon. An optical device wafer comprising a gallium nitride-based compound semiconductor or the like laminated on the front surface of a sapphire substrate is also cut along dividing lines to be divided into individual optical devices such as light emitting diodes, laser diodes or CCD's, which are widely used in electric appliances.

Cutting along the streets of the above semiconductor wafer or optical device wafer is generally carried out by using a cutting machine called "dicer". As disclosed in JP-A 2002-299295, the cutting machine comprises a chuck table for holding a workpiece such as a semiconductor wafer, a cutting means having a cutting blade for cutting the workpiece held on the chuck table, and a cutting-feed means for moving the chuck table and the cutting means relative to each other in a cutting-feed direction. The wafer is put on a dicing tape mounted on an annular dicing frame beforehand so that individually divided chips do not fall apart at the time when the wafer is cut by the cutting machine.

To put the wafer on the dicing tape and cut it, the dicing tape and the annular dicing frame, onto which this dicing tape is mounted, are required as consumption articles. Further, a tape mounting apparatus for putting the wafer on the dicing tape and mounting the dicing tape onto the dicing frame is also required, and the tape mounting step must further be carried out.

It is conceivable that the wafer is cut from the front surface side completely without putting the rear surface of the wafer on the dicing tape. However, in this case, a relief groove for a cutting blade must be formed in the chuck table for holding the wafer and a plurality of chuck tables corresponding to the different intervals between adjacent streets must be prepared.

It is also conceivable that a groove having a predetermined depth is formed along the streets in the front surface of the wafer, leaving an uncut portion behind on the rear surface side of the wafer and external force is then exerted along the streets to break the uncut portions. However, in this case, a problem arises that the rear surface of the obtained chip is chipped, thereby greatly reducing the transverse strength of the chip.

SUMMARY OF THE INVENTION

It is an object of the present invention to provide a wafer dividing method which is capable of cutting a wafer along streets without putting the wafer on a dicing tape and does not cause a reduction in the transverse strength of the obtained chip.

To attain the above object, according to the present invention, there is provided a method of dividing a wafer having a plurality of areas, which are sectioned by the streets formed on the front surface in a lattice pattern and a plurality of devices, which are formed in the sectioned areas, along streets, the method comprising the steps of:

a first cutting step for holding the front surface of the wafer on a chuck table of a cutting machine and forming a first groove having a depth that is about half of the thickness of the wafer, along the streets from the rear surface of the wafer;

a second cutting step for holding the rear surface of the wafer on a chuck table and forming a second groove which does not reach the first groove, along the streets from the front surface of the wafer; and a dividing step for breaking an uncut portion between the first groove and the second groove by exerting external force along the streets of the wafer, on which the first grooves and the second grooves have been formed.

Desirably, the first groove formed in the first cutting step should not reach the peripheral portion of the wafer.

The chuck table for holding the wafer in the first cutting step has a circular recess portion formed in the top surface of the center portion and an annular suction-holding portion formed around the circular recess portion, and an excess area surrounding the devices on the front surface of the wafer is held on the annular suction-holding portion. Desirably, the first cutting step is carried out by supplying a fluid to the circular recess portion formed in the chuck table.

The above dividing step is carried out by placing the wafer, on which the first grooves and the second grooves have been formed, on an elastic pad and exerting external force to the wafer placed on the elastic pad.

According to the present invention, since the first grooves and the second grooves are formed from the rear surface side and the front surface side of the wafer while leaving an uncut portion behind, it is not necessary to put the wafer on a dicing tape. Therefore, the dicing tape and an annular dicing frame for mounting the dicing tape are not required and a tape mounting apparatus and a tape mounting step become unnecessary.

Further, according to the present invention, although the uncut portion between the first groove and the second groove formed along the streets is broken to divide the wafer into individual chips, as it is in the center portion in the thickness direction of the chip, even when it is chipped, stress is not concentrated in the uncut portion, thereby preventing a reduction in the transverse strength of the chip.

DETAILED DESCRIPTION OF THE PREFERRED EMBODIMENTS

Preferred embodiments of the present invention will be described in more detail hereinunder with reference to the accompanying drawings.

Figure 1:
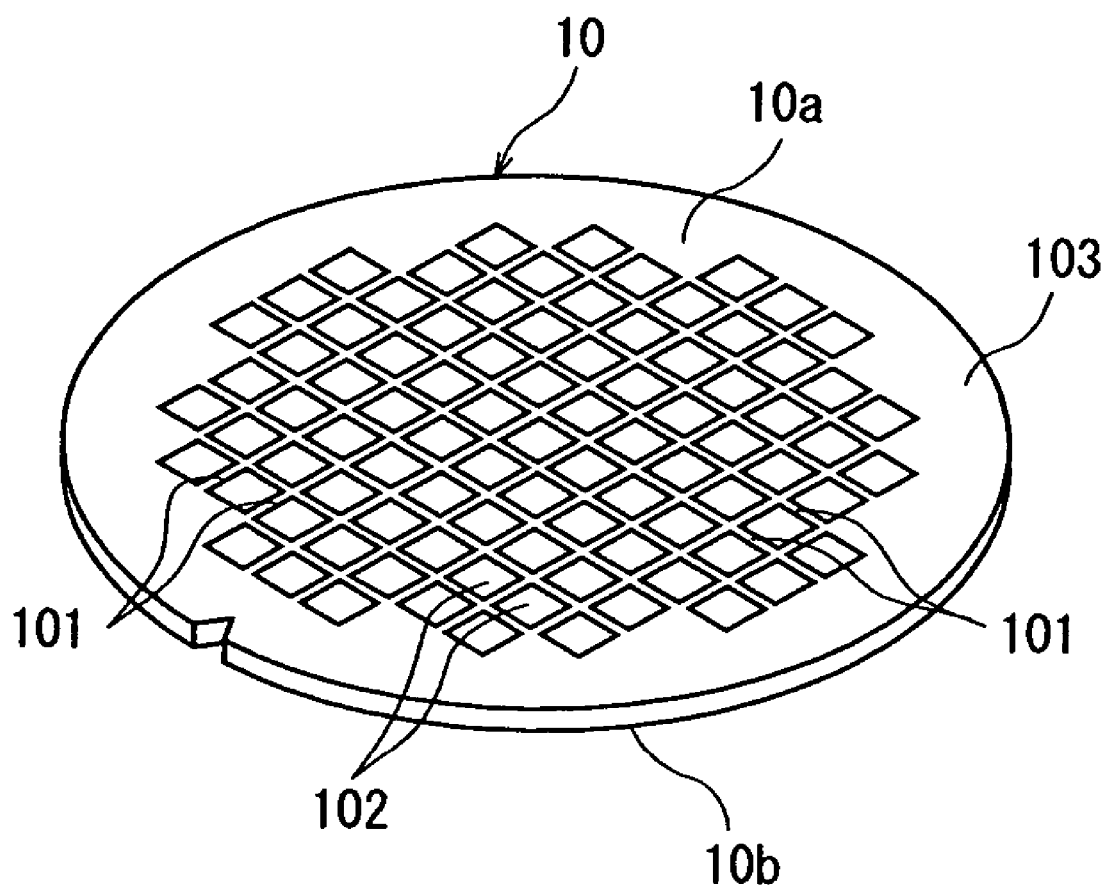
FIG. 1 is a perspective view of a semiconductor wafer as a wafer to be divided by the wafer dividing method of the present invention.

FIG. 1 is a perspective view of a semiconductor wafer to be divided into individual chips by the wafer dividing method of the present invention. The semiconductor wafer 10 shown in FIG. 1 is a silicon wafer having a thickness of, for example, 700 μm, and a plurality of streets 101 are formed on the front surface 10a in a lattice pattern. Devices 102 are formed in a plurality of areas sectioned by the lattice pattern-like streets 101. An excess area 103 surrounding the devices 102 is existent in the peripheral portion of the semiconductor wafer 10.

A description will be subsequently given of the method of dividing the semiconductor wafer 10 along the streets 101.

Here, the cutting machine for cutting the semiconductor wafer 10 along the streets 101 will be described with reference to FIG. 2.

Figure 2:
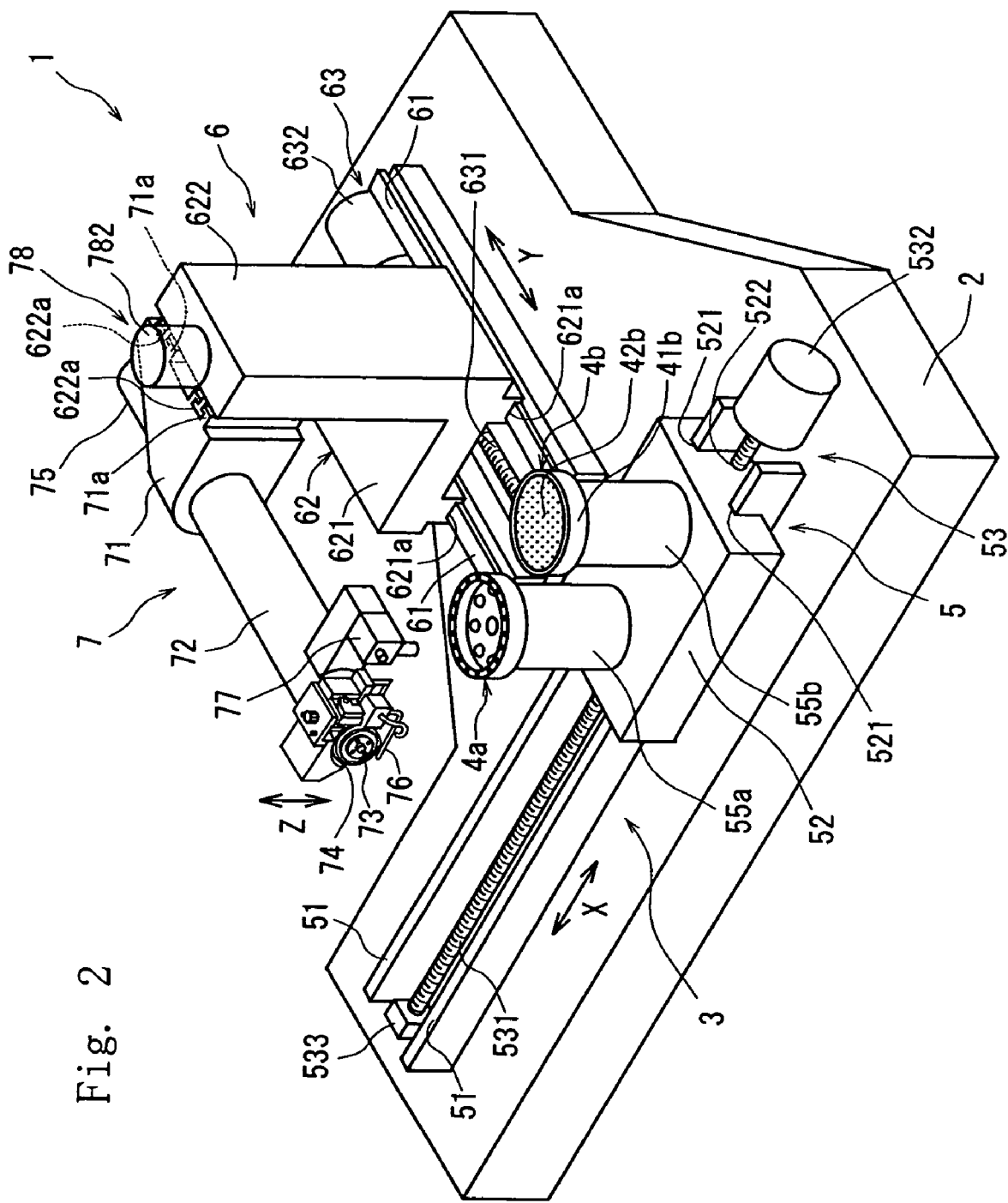
FIG. 2 is a perspective view of the principal portion of a cutting machine for cutting the wafer along streets in the wafer dividing method of the present invention.

The cutting machine 1 shown in FIG. 2 comprises a stationary base 2, a chuck table mechanism 3 for holding a workpiece, which is mounted on the stationary base 2 in such a manner that it can move in a processing-feed direction indicated by an arrow X, a spindle support mechanism 6 mounted on the stationary base 2 in such a manner that it can move in an indexing-feed direction indicated by an arrow Y (direction perpendicular to the processing-feed direction indicated by the arrow X), and a spindle unit 7 as the cutting means mounted to the spindle support mechanism 6 in such a manner that it can move in a cutting-in direction indicated by an arrow Z.

The above chuck table mechanism 3 comprises a first chuck table 4a for holding the workpiece, a second chuck table 4b arranged adjacent to the first chuck table 4a in the processing-feed direction indicated by the arrow X, and a chuck table moving mechanism 5 for moving the first chuck table 4a and the second chuck table 4b in the processing-feed direction indicated by the arrow X. The chuck table moving mechanism 5 comprises a pair of common guide rails 51 and 51 which are mounted on the stationary base 2 and arranged parallel to each other in the processing-feed direction indicated by the arrow X, a chuck table support base 52 mounted on the guide rails 51 and 51 in such a manner that it can move in the processing-feed direction indicated by the arrow X, and a processing-feed means 53 for moving the chuck table support base 52 along the pair of guide rails 51 and 51.

The above chuck table support base 52 is formed rectangular, and to-be-guided grooves 521 and 521 to be fitted to the above pair of guide rails 51 and 51 are formed in the undersurface of the chuck table support base 52. The above chuck table support base 52 can move along the pair of guide rails 51 and 51 by fitting the to-be-guided grooves 521 and 521 to the pair of guide rails 51 and 51, respectively.

The above processing-feed means 53 comprises a male screw rod 531 that is arranged between the above pair of guide rails 51 and 51 parallel thereto and a drive source such as a servo motor 532 or the like for rotary-driving the male screw rod 531. The male screw rod 531 is, at its one end, rotatably supported to a bearing block 533 fixed on the above stationary base 2 and is, at the other end, connected to the output shaft of the above servo motor 532. The male screw rod 531 is screwed into a female screw 522 formed in the center portion of the chuck table support base 52. Therefore, by driving the male screw rod 531 in a normal direction or reverse direction with the servo motor 532, the chuck table support base 52 is moved along the guide rails 51 and 51 in the processing-feed direction indicated by the arrow X.

A description will subsequently given of the above first chuck table 4a and the second chuck table 4b.

Figure 3:
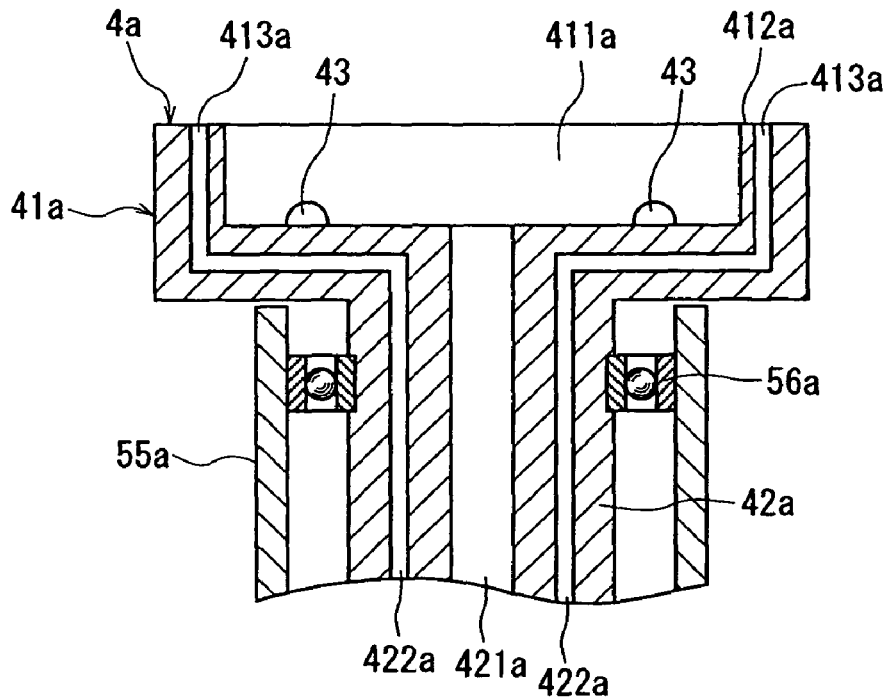
FIG. 3 is a sectional view of the principal portion of a first chuck table provided in the cutting machine shown in FIG. 2.

The first chuck table 4a will be first described with reference to FIG. 2 and FIG. 3. The first chuck table 4a is rotatably supported in a support cylinder 55a installed on the top surface of the chuck table support base 52 through a bearing 56a as shown in FIG. 3. A pulse motor (not shown) is installed in the support cylinder 55a and turns the first chuck table 4a at a predetermined angle each time. The first chuck table 4a consists of a body portion 41a and a support portion 42a as shown in FIG. 3, and the support portion 42a is rotatably supported in the above support cylinder 55a through the bearing 56a. The body portion 41a consists of a circular recess portion 411a formed in the top surface of the center portion and an annular suction-holding portion 412a formed around the circular recess portion 411a. The circular recess portion 411a is communicated with a fluid supply means (not shown) through a passage 421a formed in the support portion 42a. A plurality of infrared lamps 43 are installed on the bottom surface of the recess portion 411a. A plurality of suction-holes 413a open to the suction-holding surface that is the top surface are formed in the annular suction-holding portion 412a of the body portion 41a and communicated with a suction means (not shown) through a passage 422a formed in the support portion 42a. Therefore, the workpiece placed on the suction-holding surface which is the top surface of the annular suction-holding portion 412a is suction-held by activating the suction means that is not shown.

A description will subsequently given of the second chuck table 4b with reference to FIG. 2.

The second chuck table 4b is similar in constitution to a chuck table generally used in a cutting machine and consists of a body portion 41b and an adsorption chuck 42b mounted on the top surface of the body portion 41b. The body portion 41b is rotatably supported in a support cylinder 55b installed on the top surface of the above chuck table support base 52 and is so designed as to be turned by a pulse motor (not shown) installed in the support cylinder 55b at a predetermined angle each time. The adsorption chuck 42b is composed of a porous member such as porous ceramic and communicated with the suction means that is not shown. Therefore, the workpiece placed on the suction-holding surface that is the top surface of the adsorption chuck 42b is suction-held by activating the suction means that is not shown.

Continuing the description with reference to FIG. 2, the above spindle support mechanism 6 comprises a pair of guide rails 61 and 61, which are mounted on the stationary base 2 and arranged parallel to each other in the indexing-feed direction indicated by the arrow Y and a movable support base 62 mounted on the guide rails 61 and 61 in such a manner that it can move in the direction indicated by the arrow Y. This movable support base 62 consists of a movable support portion 621 movably mounted on the guide rails 61 and 61 and a mounting portion 622 mounted on the movable support portion 621. A pair of to-be-guided grooves 621a and 621a to be fitted to the pair of guide rails 61 and 61 are formed in the undersurface of the movable support portion 621, and the movable support base 62 can move along the guide rails 61 and 61 by fitting the to-be-guided grooves 621a and 621a to the guide rails 61 and 61, respectively. The mounting portion 622 is provided with a pair of guide rails 622a and 622a extending in the direction indicated by the arrow Z on one of its flanks.

The spindle support mechanism 6 in the illustrated embodiment comprises an indexing-feed means 63 for moving the movable support base 62 along the pair of guide rails 61 and 61 in the indexing-feed direction indicated by the arrow Y. This indexing-feed means 63 comprises a male screw rod 631 that is arranged between the above pair of guide rails 61 and 61 parallel thereto and a drive source such as a pulse motor 632 for rotary-driving the male screw rod 631. The male screw rod 631 is, at its one end, rotatably supported to a bearing block (not shown) fixed on the above stationary base 2 and is, at the other end, connected to the output shaft of the above pulse motor 632. The male screw rod 631 is screwed into a threaded through-hole formed in a female screw block (not shown) projecting from the undersurface of the center portion of the movable support portion 621 constituting the movable support base 62. Therefore, by driving the male screw rod 631 in a normal direction or reverse direction with the pulse motor 632, the movable support base 62 is moved along the guide rails 61 and 61 in the indexing-feed direction indicated by the arrow Y.

The spindle unit 7 in the illustrated embodiment comprises a unit holder 71, a spindle housing 72 secured to the unit holder 71 and a rotary spindle 73 rotatably supported to the spindle housing 72. The unit holder 71 has a pair of to-be-guided grooves 71a and 71a to be slidably fitted to the pair of guide rails 622a and 622a on the above mounting portion 622 and is supported in such a manner that it can move in the cutting-in direction indicated by the arrow Z by fitting the to-be-guided grooves 71a and 71a to the above guide rails 622a and 622a, respectively. The above rotary spindle 73 projects from the end of the spindle housing 72, and a cutting blade 74 is attached to the end of the rotary spindle 73. The rotary spindle 73 having the cutting blade 74 is rotary-driven by a drive source such as a servo motor 75, etc. A cutting water supply nozzle 76 for supplying cutting water to a cutting portion by the cutting blade 74 is provided on both sides of the cutting blade 74. Image pick-up means 77 for picking up an image of the workpiece held on the first chuck table 4a or the second chuck table 4b to detect the area to be cut by the above cutting blade 74 is installed on the end portion of the above spindle housing 72. This image pick-up means 77 comprises an optical system for capturing infrared radiation applied by the infrared lamps 43 installed on the first chuck table 4a and an image pick-up device (infrared CCD) for outputting an electric signal corresponding to infrared radiation captured by the optical system, in addition to an ordinary image pick-up device (CCD) for picking up an image with visible radiation. An image signal picked up is supplied to a control means that is not shown.

The spindle unit 7 in the illustrated embodiment comprises a cutting-in feed means 78 for moving the unit holder 71 along the pair of guide rails 622a and 622a in the direction indicated by the arrow Z. The cutting-in feed means 78 comprises a male screw rod (not shown) arranged between the guide rails 622a and 622a and a drive source such as a pulse motor 782 for rotary-driving the male screw rod, like the above processing-feed means 53 and indexing-feed means 63. By rotary-driving the male screw rod (not shown) in a normal direction or reverse direction with the pulse motor 782, the unit holder 71, the spindle housing 72 and the rotary spindle 73 are moved along the guide rails 622a and 622a in the cutting-in direction indicated by the arrow Z.

The cutting machine 1 in the illustrated embodiment is constituted as described above, and the method of cutting the above semiconductor wafer 10 along the streets 101 with the cutting machine 1 will be described hereinunder.

Figure 4:
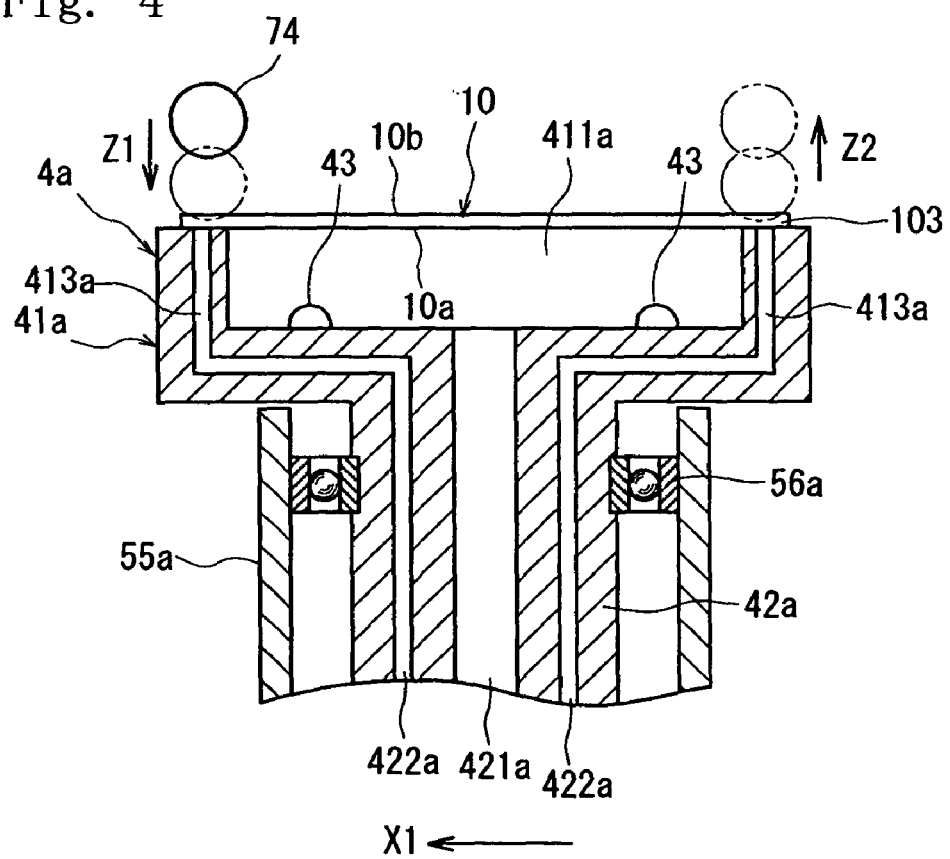
FIG. 4 is an explanatory diagram showing a first cutting step in the wafer dividing method of the present invention.

The front surface 10a of the semiconductor wafer 10 is first placed on the body portion 41a of the first chuck table 4a (therefore, the rear surface 10b of the semiconductor wafer 10 faces up). Specifically, as shown in FIG. 4, the excess area 103 formed in the peripheral portion of the semiconductor wafer 10 is placed on the suction-holding surface which is the top surface of the annular suction-holding portion 412a constituting the body portion 41a of the first chuck table 4a. At this point, a protective tape is not affixed to the front surface 10a of the semiconductor wafer 10. By activating the suction means (not shown), the semiconductor wafer 10 is suction-held on the suction-holding surface that is the top surface of the annular suction-holding portion 412a. Since the excess area 103 devoid of the devices 120 of the semiconductor wafer 10 is suction-held on the suction-holding surface that is the top surface of the annular suction-holding portion 412a, the devices 102 do not suffer damages.

After the semiconductor wafer 10 is suction-held on the first chuck table 4a as described above, the first chuck table 4a is moved to a position right below the image pick-up means 77 by activating the processing-feed means 53. After the first chuck table 4a is positioned right below the image pick-up means 77, the image pick-up means 77 and the control means (not shown) carry out alignment work for detecting the area to be cut of the semiconductor wafer 10. That is, the image pick-up means 77 and the control means (not shown) carry out image processing such as pattern matching, etc. to align a street 101 formed in a predetermined direction of the semiconductor wafer 10 with the cutting blade 74 for cutting along the street 101, thereby performing the alignment of the area to be cut. At this point, the infrared lamps 43 installed in the first chuck table 4a are turned on. Although the front surface 10a, on which the streets 101 are formed, of the semiconductor wafer 10 faces down at this point, an image of the street 101 can be picked up through the rear surface 10b of the semiconductor wafer 10 as the image pick-up means 77 is constituted by an optical system for capturing infrared radiation and an image pick-up device (infrared CCD) for outputting an electric signal corresponding to the infrared radiation captured by the optical system as described above. The alignment of the area to be cut is also similarly carried out on streets 101 formed on the semiconductor wafer 10 in a direction perpendicular to the above-predetermined direction.

After the alignment work for detecting the area to be cut of the semiconductor wafer 10 is carried out as described above, next comes a first cutting step for forming a first groove having a depth which is about half of the thickness of the wafer along the streets from the rear surface side of the wafer.

To carry out the first cutting step, the fluid supply means (not shown) is activated to supply air having, for example, a pressure 0.001 to 0.0001 MPa higher than the atmospheric pressure to the circular recess portion 411a formed in the body portion 41a of the first chuck table 4a through the passage 421a. The supply of compressed air to the recess portion 411a is aimed to prevent the center portion of the semiconductor wafer 10 from curving downward as only the excess area 103 in the peripheral portion of the semiconductor wafer 10 is held on the annular suction-holding portion 412a as described above.

Figure 5:
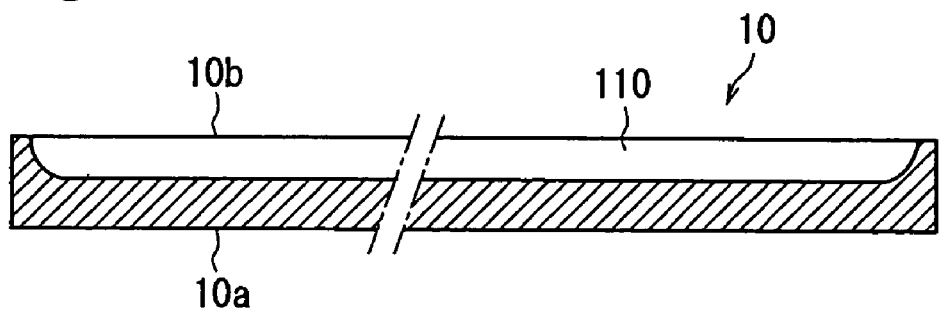
FIG. 5 is an enlarged sectional view of the semiconductor wafer, which has undergone the first cutting step in the wafer dividing method of the present invention.

Thereafter, the first chuck table 4a is moved to a cutting area, and one end (left end in FIG. 4) of the predetermined street 101 is positioned right below the cutting blade 74 as shown in FIG. 4. Specifically, the left end of the predetermined street 101 is brought to a position slightly on the left side of a position right below the cutting blade 74. The cutting blade 74 is then moved down (cutting-in fed) a predetermined distance in the direction indicated by the arrow Z1 while it is rotated, and the above processing-feed means 53 is activated to move the first chuck table 4a in the direction indicated by the arrow X1 at a predetermined cutting feed rate. The amount of feed for cutting-in is set to, for example, 340 μm from the rear surface 10b of the semiconductor wafer 10 having a thickness of 700 μm. When a position slightly on the left side of the other end (right end in FIG. 4) of the predetermined street 101 of the semiconductor wafer 10 reaches a position right below the cutting blade 74, the movement of the first chuck table 4a is stopped and the cutting blade 74 is moved up in the direction indicated by the arrow Z2. As a result, a first groove 110 having a depth which is about half of the thickness of the semiconductor wafer 10 (340 μm from the rear surface 10b of the semiconductor wafer 10 in the case of this embodiment) is formed along the predetermined street 101 in the semiconductor wafer 10 as shown in FIG. 5. This first groove 110 does not reach the peripheral portion of the semiconductor wafer 10. The first groove 110 may reach the peripheral portion of the semiconductor wafer 10 as required. In the above first cutting step, cutting water is supplied to the cutting portion by the cutting blade 77 from the cutting water supply nozzles 76.

After the above-described first cutting step is carried out along all the streets 101 formed in the predetermined direction of the semiconductor wafer 10, the first chuck table 4a is turned at 90°. The above first cutting step is then carried out along all the streets 21 formed on the semiconductor wafer 10 in a direction perpendicular to the above-predetermined direction. As a result, the first groove 110 having a depth of 340 μm from the rear surface 10b is formed along all the streets 101 of the semiconductor wafer 10.

After the first cutting step is carried out along all the streets 101 formed on the semiconductor wafer 10, the first chuck table 4a is returned to a position where it first placed the semiconductor wafer 10, the semiconductor wafer 10 which has undergone the above first cutting step is taken out from the first chuck table 4a and then, its rear surface 10b is placed on the adsorption chuck 42b of the second chuck table 4b adjacent to the first chuck table 4a (therefore, the front surface 10a of the semiconductor wafer 10 faces up). By activating the suction means that is not shown, the semiconductor wafer 10 is suction-held on the suction-holding surface of the adsorption chuck 42b. At this point, a protective tape is not affixed to the rear surface 10b of the semiconductor wafer 10.

After the semiconductor wafer 10 is thus suction-held on the second chuck table 4b, the processing-feed means 53 is activated to bring the second chuck table 4b to a position right below the image pick-up means 77. After the second chuck table 4b is positioned right below the image pick-up means 77, the image pick-up means 77 and the control means (not shown) carry out alignment work for detecting the area to be cut of the semiconductor wafer 10. That is, the image pick-up means 77 and the control means (not shown) carry out image processing such as pattern matching, etc. to align a street 101 formed in a predetermined direction of the semiconductor wafer 10 with the cutting blade 74 for cutting along the street 101. The alignment of the area to be cut is also similarly carried out on streets 101 formed on the semiconductor wafer 10 in a direction perpendicular to the above-predetermined direction.

After the alignment work for detecting the area to be cut of the semiconductor wafer 10 is carried out, a second cutting step for forming a second groove which does not reach the first groove is carried out along the street from the front surface of the wafer.

Figure 6:
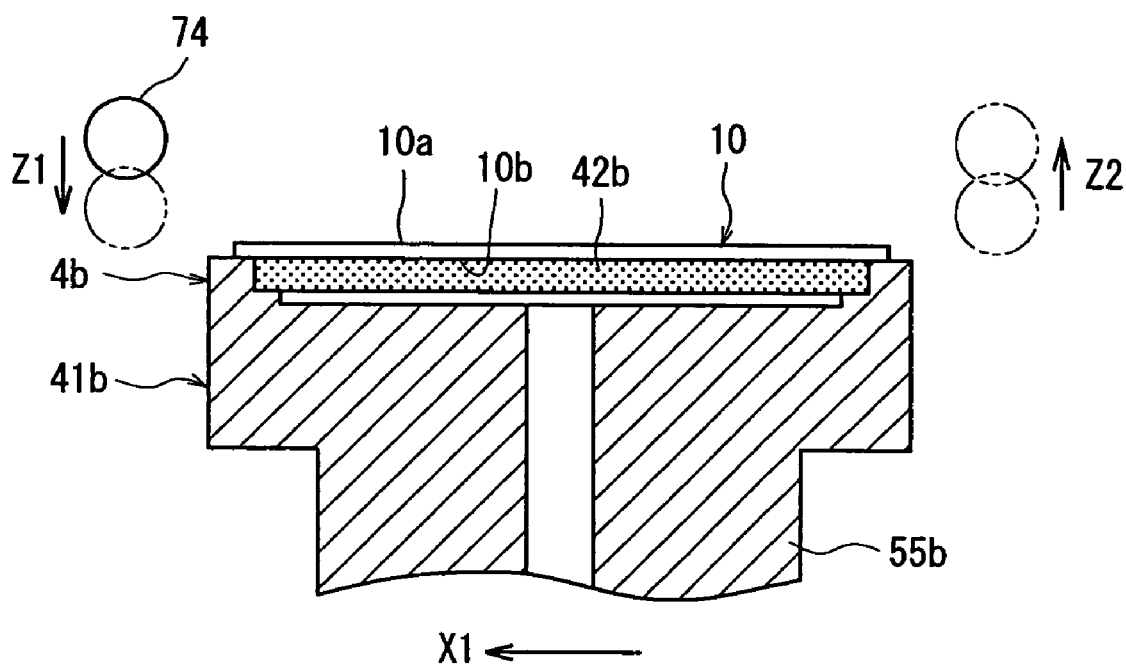
FIG. 6 is an explanatory diagram showing a second cutting step in the wafer dividing method of the present invention.
Figure 7:
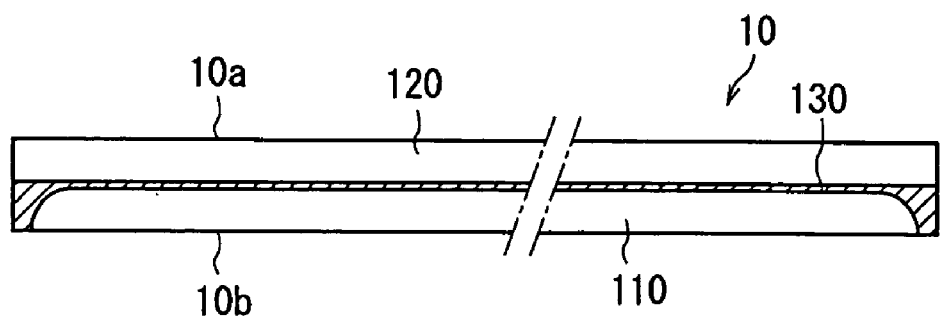
FIG. 7 is an enlarged sectional view of the semiconductor wafer, which has undergone the first cutting step and the second cutting step in the wafer dividing method of the present invention.

That is, the second chuck table 4b is moved to a cutting area, and one end of the predetermined street 101 is positioned slightly on the right side of a position right below the cutting blade 74 as shown in FIG. 6. Specifically, the cutting blade 74 is moved down (cutting-in fed) a predetermined distance in the direction indicated by the arrow Z1 while it is rotated, and the above processing-feed means 53 is activated to move the second chuck table 4b in the direction indicated by the arrow X1 in FIG. 6 at a predetermined cutting-feed rate. The amount of feed for cutting-in is set to, for example, 340 μm from the front surface 10a of the semiconductor wafer 10 having a thickness of 700 μm. When the other end of the predetermined street 101 of the semiconductor wafer 10 held on the second chuck table 4b reaches a position slightly on the left side of a position right below the cutting blade 74 as shown in FIG. 6, the movement of the second chuck table 4b is stopped and the cutting blade 74 is moved up in the direction indicated by the arrow Z2. As a result, a second groove 120 having a depth which is about half of the thickness of the semiconductor wafer 10 (340 μm from the front surface 10a of the semiconductor wafer 10 in the case of this embodiment) is formed along the predetermined street 101 in the semiconductor wafer 10 as shown in FIG. 7. This second groove 120 reaches the peripheral portion of the semiconductor wafer 10. Therefore, an uncut portion 130 having a thickness of 20 μm is left behind in the center portion in the thickness direction of the semiconductor wafer 10 between the first groove 110 and the second groove 120. In the above second cutting step, cutting water is supplied to the cutting portion by the cutting blade 74 from the cutting water supply nozzles 76. Although the first groove 110 formed rear surface 10b of the semiconductor wafer 10 is suction-held on the second chuck table 4b, as the first groove 110 does not reach the peripheral portion of the semiconductor wafer 10, the entry of cutting water into the first grooves 110 can be prevented, thereby making it possible to prevent the contamination of the rear surface 10b of the semiconductor wafer 10.

After the above second cutting step is carried out along all the streets 101 formed on the semiconductor wafer 10 in the predetermined direction, the second chuck table 4b is turned at 90°. The above second cutting step is carried out along all the streets 101 formed on the semiconductor wafer 10 in a direction perpendicular to the above-predetermined direction. As a result, the second groove 120 having a depth of 340 μm from the front surface 10a is formed along all the streets 101 of the semiconductor wafer 10. Therefore, the uncut portion 130 having a thickness of 20 μm is left behind in the center portion in the thickness direction of the semiconductor wafer 10 between the first groove 110 and the second groove 120. Since the uncut portion 130 is left behind, cutting water does not enter the rear surface 10b of the semiconductor wafer 10 and does not contaminate the semiconductor wafer 10.

After the second cutting step is carried out along all the streets 101 formed on the semiconductor wafer 10, the second chuck table 4b is returned to a position where it first placed the semiconductor wafer 10 and the semiconductor wafer 10 which has undergone the above first and second cutting steps is taken out from the second chuck table 4b. At this point, it is desired to use an entire surface suction pad for suction-holding the entire surface of the semiconductor wafer 10 as a conveying means.

Figure 8:
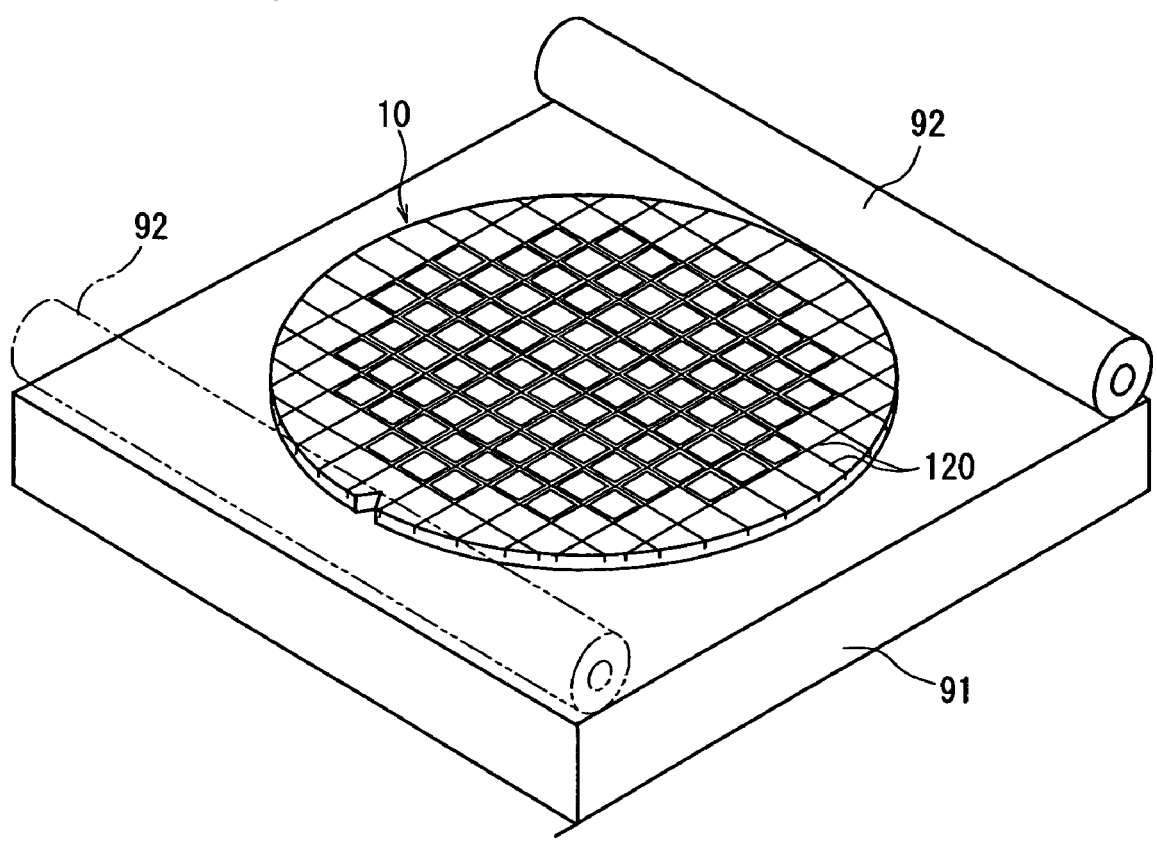
FIG. 8 is an explanatory diagram showing a dividing step in the wafer dividing method of the present invention.
Figure 9:
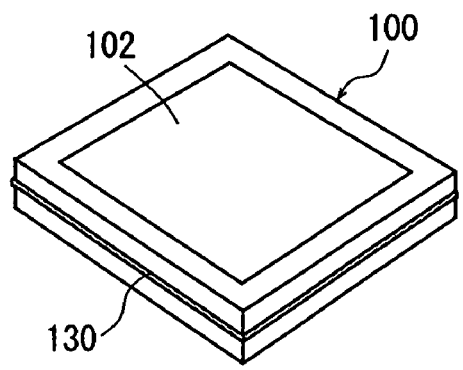
FIG. 9 is a perspective view of a semiconductor chip obtained by the wafer dividing method of the present invention.

The semiconductor wafer 10 which has been taken out from the second chuck table 4b is placed on an elastic pad 91 made of an elastic material such as rubber of a dividing apparatus 9 as shown in FIG. 8. An elastic roller 92 is rolled over the semiconductor wafer 10 placed on the elastic pad 91 while it is pressed against the semiconductor wafer 10. As a result, a bending load is applied along the streets of the semiconductor wafer 10 to break the uncut portions 130 between the first grooves 110 and the second grooves 120, whereby the semiconductor wafer 10 is divided into individual semiconductor chips 100 as shown in FIG. 9. Although the uncut portion 130 is broken as shown in FIG. 8, as it is in the center portion in the thickness direction of the semiconductor chip 100, even when it is chipped, stress does not concentrate in the uncut portion 130, thereby preventing a reduction in the transverse strength of the semiconductor chip 100.

What is claimed is:

1. A method of dividing a wafer having a plurality of areas, which are sectioned by streets formed on the front surface in a lattice pattern and a plurality of devices, which are formed in the sectioned areas, along the streets, the method comprising the steps of:
    a first cutting step for holding the front surface of the wafer directly on a chuck table of a cutting machine and forming a first groove having a depth that is about half of the thickness of the wafer, along the streets from the rear surface of the wafer;
    a second cutting step performed after the first cutting step for holding the rear surface of the wafer on the chuck table and forming, up to the center portion in the thickness direction of the wafer, a second groove which does not reach the first groove so that an uncut portion is left between the first groove and the second groove, along the streets from the front surface of the wafer; and
    a dividing step performed after the second cutting step for breaking the uncut portion by exerting external force along the streets of the wafer, on which the first grooves and the second grooves have been formed, wherein
    the first groove formed in the first cutting step does not reach a peripheral portion of the wafer, and
    in the second cutting step, the chuck table holding the rear surface of the wafer is an adsorption chuck, and a cutting water supply nozzle for supplying cutting water to a cutting portion on both sides of a cutting blade, so that at the time of cutting, entry of cutting water into the rear surface of the wafer is prevented by an area where the first groove does not reach the peripheral portion of the wafer.

2. The method of dividing a wafer according to claim 1, wherein the chuck table for holding the wafer in the first cutting step has a circular recess portion formed in the top surface of the center portion and an annular suction-holding portion formed around the circular recess portion, and an excess area surrounding the devices on the front surface of the wafer is held on the annular suction-holding portion.

3. The method of dividing a wafer according to claim 2, wherein the first cutting step is carried out by supplying a fluid to the circular recess portion formed in the chuck table.

4. The method of dividing a wafer according to claim 1, wherein the dividing step is carried out by placing the wafer, on which the first grooves and the second grooves have been formed, on an elastic pad and exerting external force to the wafer placed on the elastic pad.

5. The method of dividing a wafer according to claim 1, wherein
    the first groove formed in the first cutting step does not reach the peripheral portion of the wafer,
    the chuck table for holding the wafer in the first cutting step has a circular recess portion formed in the top surface of the center portion and an annular suction-holding portion formed around the circular recess portion,
    an excess area surrounding the devices on the front surface of the wafer is held on the annular suction-holding portion,
    the first cutting step is carried out by supplying a fluid to the circular recess portion formed in the chuck table, and
    the dividing step is carried out by placing the wafer, on which the first grooves and the second grooves have been formed, on an elastic pad and exerting external force to the wafer placed on the elastic pad.

* * * * *